(12) United States Patent
Wakamoto

(10) Patent No.: US 10,112,210 B2
(45) Date of Patent: Oct. 30, 2018

(54) COATING PROCESSING APPARATUS FOR COATING LIQUID ON SUBSTRATE MOVING IN A HORIZONTAL DIRECTION WITH SLIT-SHAPED EJECTING PORT MOVING IN A VERTICAL DIRECTION

(71) Applicant: Tokyo Electron Limited, Tokyo (JP)

(72) Inventor: Yukihiro Wakamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 5 days.

(21) Appl. No.: 14/715,721

(22) Filed: May 19, 2015

(65) Prior Publication Data
US 2015/0336114 A1 Nov. 26, 2015

(30) Foreign Application Priority Data
May 22, 2014 (JP) ................................ 2014-106078

(51) Int. Cl.
| | |
|---|---|
| *B05C 11/10* | (2006.01) |
| *B05C 5/02* | (2006.01) |
| *H01L 21/67* | (2006.01) |
| *B05B 12/02* | (2006.01) |

(52) U.S. Cl.
CPC ........ *B05C 11/1015* (2013.01); *B05C 5/0208* (2013.01); *B05C 5/0216* (2013.01); *B05C 5/0254* (2013.01); *H01L 21/6715* (2013.01); *H01L 21/67253* (2013.01); *B05B 12/02* (2013.01)

(58) Field of Classification Search
CPC ......... B05C 11/105; B05C 9/02; B05C 11/08; B05C 9/12; B05C 5/0254; B05C 5/0262; B05D 1/005; B05D 1/26; B05D 1/28; H01L 21/02282; H01L 21/6715; B01J 19/1887; B25J 9/1651; B25J 11/0075; H05K 3/0091
USPC ............................. 118/52, 401, 321; 427/240
See application file for complete search history.

(56) References Cited

U.S. PATENT DOCUMENTS

| | | | | | |
|---|---|---|---|---|---|
| 4,451,507 | A | * | 5/1984 | Beltz ........................ | B05C 11/08 118/320 |
| 5,270,079 | A | * | 12/1993 | Bok .......................... | B05C 9/02 427/429 |
| 5,455,062 | A | * | 10/1995 | Muhlfriedal .............. | B05C 9/02 118/401 |

(Continued)

FOREIGN PATENT DOCUMENTS

| | | | | | |
|---|---|---|---|---|---|
| JP | 2005019560 A | * | 1/2005 | ............... | G03F 7/16 |
| JP | 2011-167603 A | | 9/2011 | | |

*Primary Examiner* — Karl Kurple
(74) *Attorney, Agent, or Firm* — Abelman, Frayne & Schwab

(57) ABSTRACT

At the time of initiating coating, when a first end of an ejecting port of a coating nozzle is located at one end of a peripheral edge of a wafer, the wafer and the coating nozzle are relatively moved by a moving mechanism while exposing a coating liquid from the ejecting port. During the coating, the wafer and the coating nozzle are relatively moved by the moving mechanism while the coating liquid ejected from the ejecting port is in contact with the wafer, to coat the coating liquid on the wafer. At the time of finishing the coating, when a second end of the ejecting port is located at the other end of the peripheral edge of the wafer, the wafer and the coating nozzle are relatively moved by the moving mechanism while exposing the coating liquid from the ejecting port.

5 Claims, 10 Drawing Sheets

(56) References Cited

U.S. PATENT DOCUMENTS

| | | | |
|---|---|---|---|
| 5,688,324 A * | 11/1997 | Umaba | B05C 9/02 118/401 |
| 6,013,315 A * | 1/2000 | Mandal | B05B 1/044 118/320 |
| 6,139,639 A * | 10/2000 | Kitamura | B05C 5/0208 118/410 |
| 6,225,240 B1 * | 5/2001 | You | B05D 1/005 257/E21.243 |
| 6,231,671 B1 * | 5/2001 | Ciliske | B05C 5/0295 118/410 |
| 6,317,642 B1 * | 11/2001 | You | B05D 1/005 427/240 |
| 6,407,009 B1 * | 6/2002 | You | H01L 21/3124 257/E21.262 |
| 6,613,148 B1 * | 9/2003 | Rasmussen | B05C 9/02 118/401 |
| 8,020,510 B2 * | 9/2011 | Emoto | B05C 5/0254 118/410 |
| 8,277,900 B2 * | 10/2012 | Nomoto | B82Y 10/00 427/256 |
| 8,770,141 B2 * | 7/2014 | Ikagawa | B05C 5/0262 118/682 |
| 8,893,644 B2 * | 11/2014 | Nakamura | B05B 1/044 118/24 |
| 9,016,235 B2 * | 4/2015 | Ikagawa | B05C 11/1007 118/323 |
| 9,067,234 B2 * | 6/2015 | Tanabe | B05C 13/02 |
| 9,162,249 B2 * | 10/2015 | Koyama | B05C 5/0225 |
| 2001/0029111 A1 * | 10/2001 | You | B05D 1/005 438/782 |
| 2003/0111011 A1 * | 6/2003 | Gibson | B05C 5/0254 118/410 |
| 2006/0096528 A1 * | 5/2006 | Kawatake | B05C 5/0262 118/407 |
| 2006/0292295 A1 * | 12/2006 | Kwon | C11D 11/0047 427/162 |
| 2008/0178799 A1 * | 7/2008 | Kohno | B05C 9/06 118/313 |
| 2009/0202730 A1 * | 8/2009 | Yamaoka | B05C 5/0258 427/420 |
| 2010/0043700 A1 * | 2/2010 | Trefz | D21H 23/48 118/68 |
| 2010/0233637 A1 * | 9/2010 | Arima | H01L 21/6715 430/325 |
| 2011/0059246 A1 * | 3/2011 | Miyamoto | H01L 21/6715 427/345 |
| 2011/0236570 A1 * | 9/2011 | Higashi | B05C 5/0266 427/162 |
| 2012/0000420 A1 * | 1/2012 | Ikagawa | B05C 5/0258 118/708 |
| 2012/0085282 A1 * | 4/2012 | Ikagawa | B05C 5/0262 118/692 |
| 2012/0276753 A1 * | 11/2012 | Yoshihara | H01L 21/6715 438/782 |
| 2012/0288635 A1 * | 11/2012 | Tanabe | B05C 13/02 427/424 |
| 2013/0236651 A1 * | 9/2013 | Komatsubara | B05C 21/00 427/430.1 |
| 2013/0252432 A1 * | 9/2013 | Nakamura | H01L 51/0017 438/706 |
| 2014/0000518 A1 * | 1/2014 | Ishii | H01L 21/6715 118/712 |
| 2014/0042124 A1 * | 2/2014 | Ikagawa | B05C 5/0208 216/90 |
| 2014/0057081 A1 * | 2/2014 | Rothen | B29D 7/01 428/161 |
| 2014/0121831 A1 * | 5/2014 | Kim | B25J 11/0075 700/245 |
| 2014/0186537 A1 * | 7/2014 | Ikagawa | F04B 49/02 427/424 |
| 2014/0352611 A1 * | 12/2014 | Maki | B05B 15/025 118/302 |
| 2015/0096492 A1 * | 4/2015 | Ishii | B05C 5/0254 118/323 |
| 2015/0211122 A1 * | 7/2015 | Chang | G06F 17/18 156/345.27 |
| 2015/0298162 A1 * | 10/2015 | Ikagawa | B05C 11/1002 427/421.1 |
| 2016/0016185 A1 * | 1/2016 | Park | H01L 27/124 257/72 |
| 2016/0038965 A1 * | 2/2016 | Wakamoto | B05C 5/0254 118/704 |

* cited by examiner

Prior Art

COATING PROCESSING APPARATUS FOR COATING LIQUID ON SUBSTRATE MOVING IN A HORIZONTAL DIRECTION WITH SLIT-SHAPED EJECTING PORT MOVING IN A VERTICAL DIRECTION

CROSS-REFERENCE TO RELATED APPLICATIONS

This application is based on and claims priority from Japanese Patent Application No. 2014-106078, filed on May 22, 2014, with the Japan Patent Office, the disclosure of which is incorporated herein in its entirety by reference.

TECHNICAL FIELD

The present disclosure relates to a coating processing apparatus for coating a coating liquid on a substrate.

BACKGROUND

A so-called spin coating method has been widely known as a method of coating a coating liquid on a substrate such as, for example, a semiconductor wafer or a glass substrate. In the spin coating method, a coating liquid is coated on the surface of the substrate by supplying the coating liquid from a coating nozzle to the central portion of the substrate in a state where the substrate is rotated so that the coating liquid is diffused on the substrate by a centrifugal force.

When the spin coating method is used, the coating liquid supplied to the substrate is diffused with a high speed rotation. Thus, most of the supplied coating liquid is scattered from the peripheral portion of the substrate, thereby being wasted.

Therefore, in order to suppress such waste of the coating liquid, for example, Japanese Patent Laid-Open Publication No. 2011-167603 discloses a method of coating a coating liquid on a substrate by drawing out the coating liquid from an ejecting port of a coating nozzle by a capillary phenomenon. Specifically, a slit-shaped ejecting port formed at the lower end face of the coating nozzle is positioned close to the substrate to maintain the ejecting port and the substrate in a state where a predetermined gap is formed therebetween. In a state where the coating liquid ejected from the ejecting port is brought into contact with the substrate, the substrate and the coating nozzle are relatively moved in the horizontal direction, for example, in the radial direction of the substrate. Then, the coating liquid is drawn out from the ejecting port by the capillary phenomenon and coated on the substrate.

SUMMARY

The present disclosure provides a coating processing apparatus for coating a coating liquid to a substrate. The coating processing apparatus includes: a coating nozzle configured to eject the coating liquid to the substrate from a slit-shaped ejecting port; a moving mechanism configured to relatively move the substrate and the coating nozzle in a direction perpendicular to a longitudinal direction of the ejecting port; and a control unit configured to control the coating nozzle and the moving mechanism. The control unit controls the coating nozzle and the moving mechanism to execute: an initiating step of relatively moving the substrate and the coating nozzle by the moving mechanism while exposing the coating liquid from the ejecting port when a first end of the ejecting port at the substrate side is located at one end of a peripheral edge of the substrate, a coating step of coating the coating liquid on the substrate by relatively moving the substrate and the coating nozzle in a horizontal direction by the moving mechanism while bringing the coating liquid ejected from the ejecting port into contact with the substrate, and a finishing step of relatively moving the substrate and the coating nozzle by the moving mechanism while exposing the coating liquid from the ejecting port when a second end of the ejecting port opposite to the first end is located at the other end of the peripheral edge of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

As a result of an extensive study, it is found that when a coating liquid is coated on a substrate using the method disclosed in Japanese Patent Laid-Open Publication No. 2011-167603, an area in which the film thickness of the coating liquid becomes locally thick may occur in the peripheral edge of the substrate at the time of initiating and finishing the coating.

Figure 19:
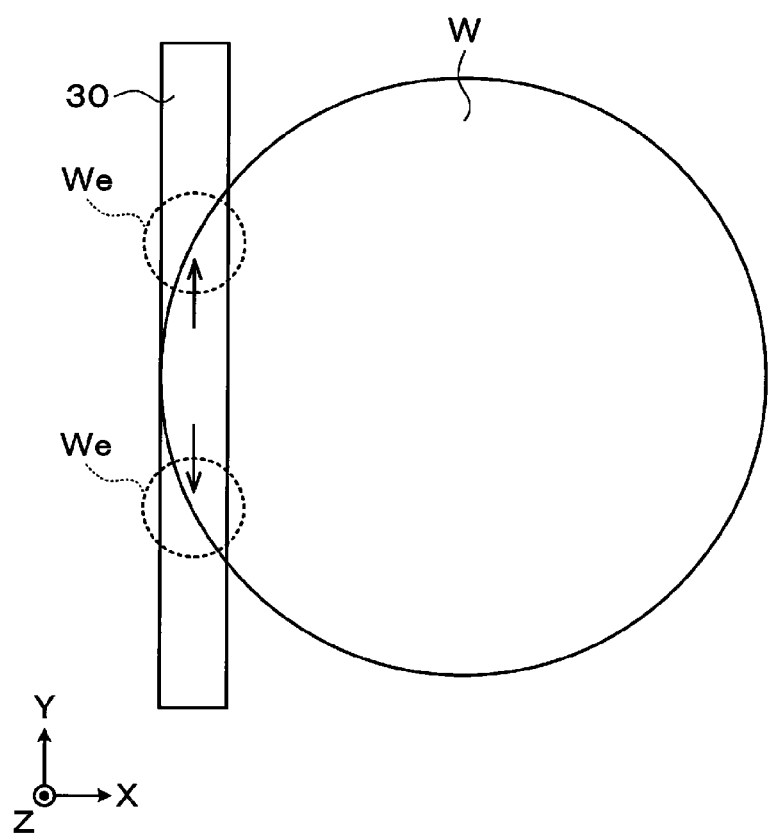
FIG. 19 is an explanatory view of a conventional coating processing operation.

At the time of initiating the coating, for example, as illustrated in FIG. 19, a coating nozzle 30 is disposed above a peripheral edge of a wafer W (at a coating initiation position) in the inside of the wafer W as a substrate. Then, in a state where the coating nozzle 30 is stopped with respect to the wafer W, a coating liquid ejected from an ejecting port of the coating nozzle 30 is brought into contact with the wafer W. Then, the coating liquid is diffused toward the outside in the longitudinal direction of the coating nozzle 30 (Y-axis direction in FIG. 19), and is held and accumulated by surface tension at both ends (We, We) (the dotted line in FIG. 19) in the peripheral edge of the wafer W. Accordingly, the film thickness of the coating liquid becomes locally thick in the peripheral edge of the wafer W.

Also, at the time of finishing the coating as well, in a state where the coating nozzle 30 is disposed above the peripheral edge of the wafer W in the inside of the wafer W, and is stopped with respect to the wafer W, the coating liquid ejected from the ejecting port of the coating nozzle 30 is separated from the wafer W. Then, the coating liquid is accumulated at both ends in the peripheral edge of the wafer W as at the time of initiating the coating, and the film thickness of the coating liquid becomes locally thick in the peripheral edge of the wafer W.

When the method disclosed in Japanese Patent Laid-Open Publication No. 2011-167603 is used, the coating liquid may not be uniformly coated within the substrate plane as described above.

The present disclosure has been made in view of the foregoing, and an object of the present disclosure is to uniformly coat a coating liquid within a substrate plane.

In order to achieve the object, the present disclosure provides a coating processing apparatus for coating a coating liquid on a substrate. The coating processing apparatus includes: a coating nozzle configured to eject the coating liquid to the substrate from a slit-shaped ejecting port; a moving mechanism configured to relatively move the substrate and the coating nozzle in a direction perpendicular to a longitudinal direction of the ejecting port; and a control unit configured to control the coating nozzle and the moving mechanism. The control unit controls the coating nozzle and the moving mechanism to execute: an initiating step of relatively moving the substrate and the coating nozzle by the moving mechanism while exposing the coating liquid from the ejecting port when a first end of the ejecting port at the substrate side is located at one end of a peripheral edge of the substrate, a coating step of coating the coating liquid on the substrate by relatively moving the substrate and the coating nozzle in a horizontal direction by the moving mechanism while bringing the coating liquid ejected from the ejecting port into contact with the substrate, and a finishing step of relatively moving the substrate and the coating nozzle by the moving mechanism while exposing the coating liquid from the ejecting port when a second end of the ejecting port opposite to the first end is located at the other end of the peripheral edge of the substrate.

According to the present disclosure, before the coating is initiated, for example, the coating nozzle is disposed outside the substrate. Then, at the time of initiating the coating, when the first end of the ejecting port is located at one end of the peripheral edge of the substrate, and the coating liquid ejected from the ejecting port comes in contact with one end of the peripheral edge of the substrate, the substrate and the coating nozzle are relatively moved. Then, unlike the conventional technology, at the one end of the peripheral edge of the substrate, the coating liquid may be suppressed from being diffused in the longitudinal direction of the coating nozzle, and suppressed from being accumulated in the peripheral edge of the substrate. Accordingly, it is possible to suppress the film thickness of the coating liquid from becoming thick locally at one end of the peripheral edge of the substrate.

At the time of finishing the coating, when the second end of the ejecting port is located at the other end of the peripheral edge of the substrate and the coating liquid ejected from the ejecting port is separated from the other end of the peripheral edge of the substrate, the substrate and the coating nozzle are relatively moved. Then, unlike the conventional technology, at the other end of the peripheral edge of the substrate, the coating liquid may be suppressed from being diffused in the longitudinal direction of the coating nozzle, and suppressed from being accumulated in the peripheral edge of the substrate. Accordingly, it is possible to suppress the film thickness of the coating liquid from becoming thick locally at the other end of the peripheral edge of the substrate.

As described above, according to the present disclosure, the coating liquid may be uniformly coated within the substrate plane.

The control unit may control the moving mechanism so that in the initiating step, the substrate and the coating nozzle are relatively moved at a first speed until the second end is located at the one end of the peripheral edge of the substrate at least after the first end is located at the one end of the peripheral edge of the substrate, and in the coating step, the substrate and the coating nozzle are relatively moved at a second speed faster than the first speed.

The control unit may control the moving mechanism so that in the finishing step, the substrate and the coating nozzle are relatively moved at a speed equal to a speed at which the substrate and the coating nozzle are relatively moved in the coating step.

The coating nozzle may supply the coating liquid to the substrate by drawing out the coating liquid from the ejecting port by a capillary phenomenon.

According to the present disclosure, a coating liquid may be uniformly coated within a substrate plane.

Hereinafter, an exemplary embodiment of the present disclosure will be described with reference to accompanying drawings. The present disclosure is not limited by the exemplary embodiment described below.

Figure 1:
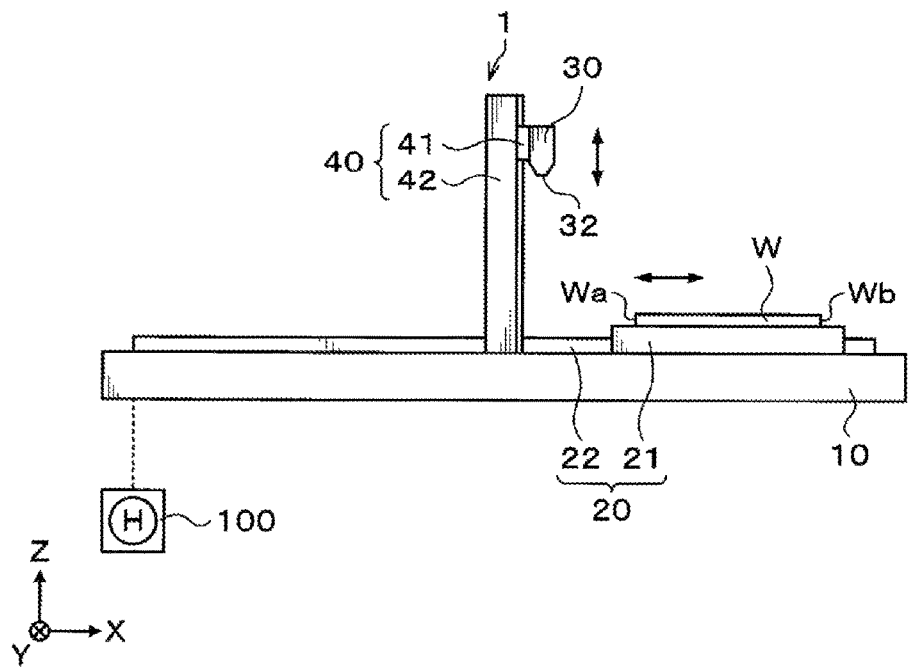
FIG. 1 is a schematic side view illustrating a configuration of a coating processing apparatus according to an exemplary embodiment.
Figure 2:
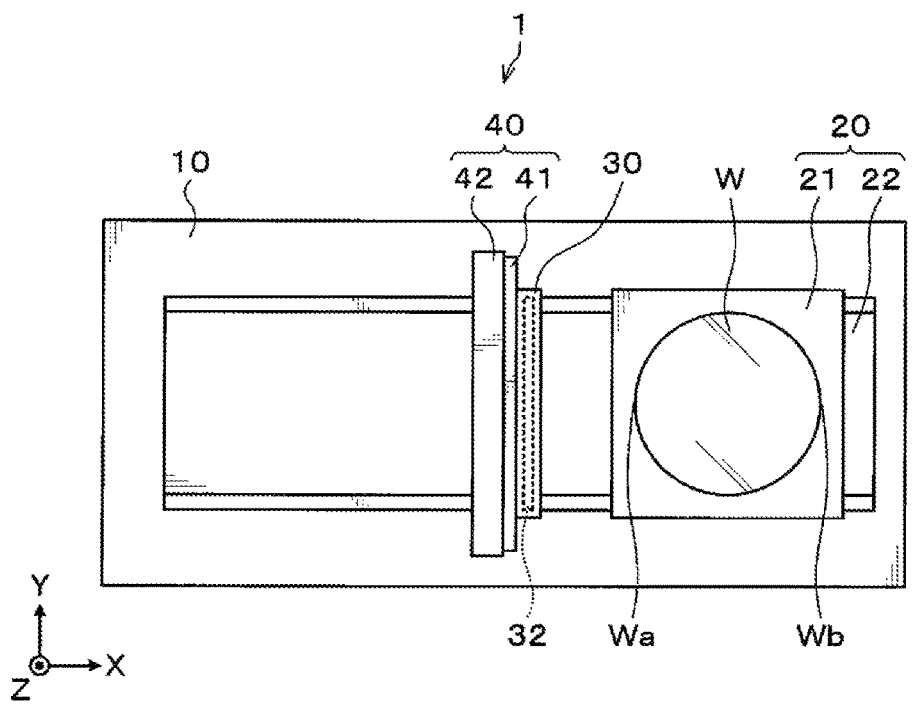
FIG. 2 is a schematic plan view illustrating a configuration of the coating processing apparatus according to the exemplary embodiment.

First, a configuration of a coating processing apparatus according to an exemplary embodiment will be described with reference to FIGS. 1 and 2. FIG. 1 is a schematic side view illustrating a configuration of a coating processing apparatus 1 according to an exemplary embodiment. FIG. 2 is a schematic plan view illustrating a configuration of the coating processing apparatus 1 according to the exemplary embodiment. Hereinafter, an X-axis direction, a Y-axis direction, and a Z-axis direction which are orthogonal to each other will be defined in order to clarify the positional relationship. The positive Z-axis direction is defined as a vertical upward direction.

As illustrated in FIGS. 1 and 2, the coating processing apparatus 1 includes a mounting unit 10, a moving mechanism 20, a coating nozzle 30, and an elevating mechanism 40.

The moving mechanism 20 is a mechanism configured to move a wafer W as a substrate in a horizontal direction (X-axis direction) and includes a wafer holding unit 21 and a driving unit 22. The wafer holding unit 21 has a horizontal top surface formed with a suction port (not illustrated), and attracts and holds the wafer W on the horizontal top surface through the suction from the suction port. The driving unit 22 is provided on the mounting unit 10, and moves the wafer holding unit 21 in the horizontal direction. As the moving mechanism 20 moves the wafer holding unit 21 using the driving unit 22, the wafer W held by the wafer holding unit 21 is moved in the horizontal direction.

In the following description, an end of the peripheral edge of the wafer W at the negative X-axis direction side is referred to as one end Wa, and an end at the positive X-axis direction side is referred to as the other end Wb.

The coating nozzle 30 is an elongated nozzle which extends in a direction (the Y-axis direction) perpendicular to the movement direction (the X-axis direction) of the wafer W, and is disposed above the wafer W held by the wafer holding unit 21. A configuration of the coating nozzle 30 will be described later.

The elevating mechanism 40 is a mechanism configured to move up and down the coating nozzle 30 in the vertical direction (Z-axis direction), and includes a fixing member 41 and a driving unit 42. The fixing member 41 is a member configured to fix the coating nozzle 30. The driving unit 42 extends in the horizontal direction (Y-axis direction) and the vertical direction and has a door type structure which bridges over both sides of the driving unit 22, and moves the fixing member 41 in the vertical direction. The elevating mechanism 40 moves the fixing member 41 in the vertical direction by using the driving unit 42, thereby moving up and down the coating nozzle 30 fixed to the fixing member 41.

In addition to the mounting unit 10, the moving mechanism 20, the coating nozzle 30, and the elevating mechanism 40, the coating processing apparatus 1 is provided with, for example, a nozzle cleaning unit (not illustrated) configured to remove the coating liquid attached to a distal portion of the coating nozzle 30, a nozzle waiting unit (not illustrated) configured to accommodate the coating nozzle 30, and a moving mechanism (not illustrated) configured to move the nozzle cleaning unit or the nozzle waiting unit.

The coating processing apparatus 1 is provided with a control unit 100 as illustrated in FIG. 1. The control unit 100 is, for example, a computer, and has a program storage unit (not illustrated). The program storage unit stores a program which controls operations such as, for example, an ejection operation of the coating liquid by the coating nozzle 30, a moving operation of the coating nozzle 30 by the moving mechanism 20, thereby controlling the coating processing in the coating processing apparatus 1. The program storage unit also stores a program which controls operations of other various driving systems, thereby realizing the coating processing in the coating processing apparatus 1. The program is recorded in a computer-readable recording medium H such as, for example, a computer-readable hard disk (HD), a flexible disk (FD), a compact disk (CD), a magneto optical disk (MO), or a memory card. The program is installed to the control unit 100 from the recording medium H to be used.

Figure 3:
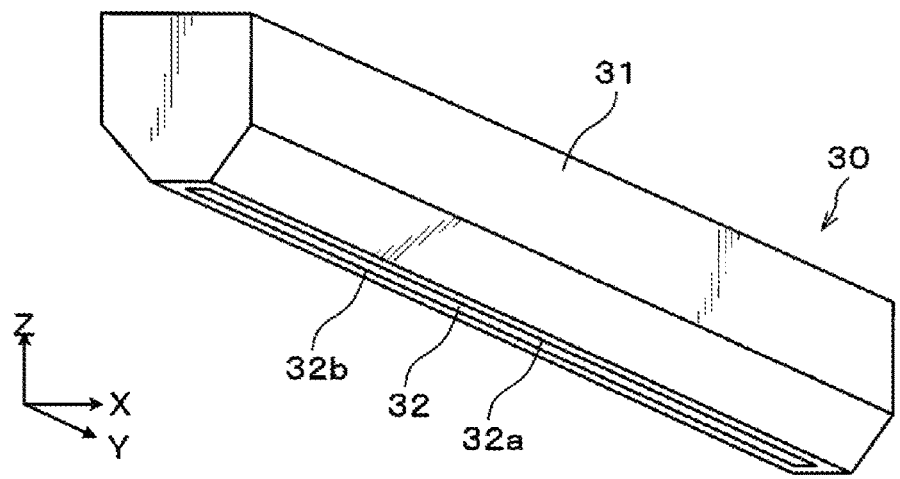
FIG. 3 is a perspective view illustrating a configuration of a coating nozzle.

Hereinafter, a configuration of the coating nozzle 30 described above will be described. As illustrated in FIG. 3, the coating nozzle 30 includes a main body 31 which extends with a length larger than the diameter of the wafer W in a direction (Y-axis direction) perpendicular to the movement direction (X-axis direction) of the wafer W. An ejecting port 32 configured to eject the coating liquid to the wafer W is formed in the lower end face of the main body 31. The ejecting port 32 is a slit-shaped ejecting port which extends with a length larger than the diameter of the wafer W along the longitudinal direction (Y-axis direction) of the main body 31.

Figure 4:
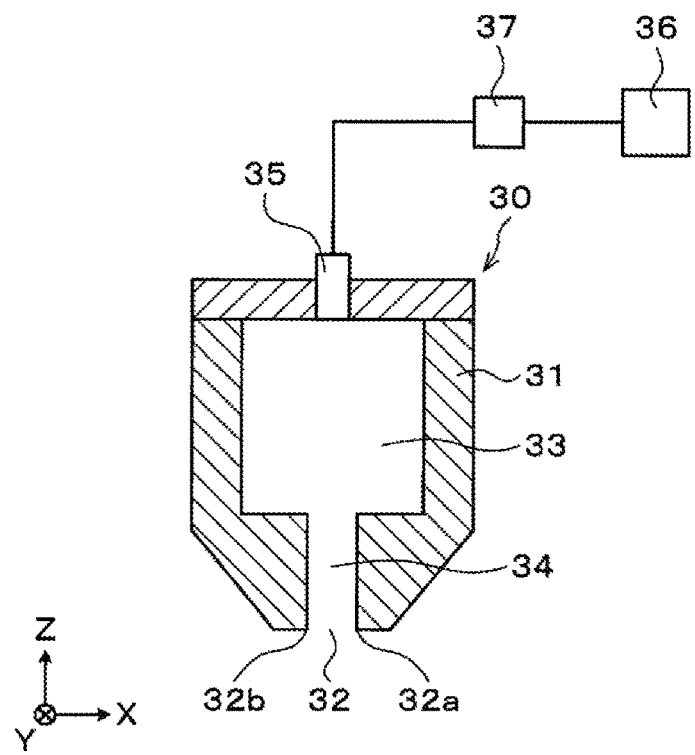
FIG. 4 is a vertical cross-sectional view illustrating an inner configuration of the coating nozzle.

As illustrated in FIGS. 3 and 4, in the following description, the end of the ejecting port 32 at the positive X-axis direction side is referred to as a first end 32a, and the end at the negative X-axis direction side is referred to as a second end 32b.

As illustrated in FIG. 4, a storage chamber 33 configured to store the coating liquid is formed within the coating nozzle 30. The length of the storage chamber 33 in the longitudinal direction of the main body 31 is the same as the length of the ejecting port 32 in the longitudinal direction. A flow path 34 is formed at the lower end of the storage chamber 33 to extend in the vertical direction and to communicate with the ejecting port 32. The length of the flow path 34 in the longitudinal direction of the main body 31 is also the same as the length of the ejecting port 32 and the storage chamber 33 in the longitudinal direction.

A supply tube 35 configured to supply the coating liquid into the storage chamber 33 is connected to the storage chamber 33. The supply tube 35 is communicated with a coating liquid supply source 36 configured to store the coating liquid therein. A supply device group 37 is provided in the supply tube 35, which includes, for example, a valve or a flow rate regulator for controlling the flow of the coating liquid.

Figure 5:
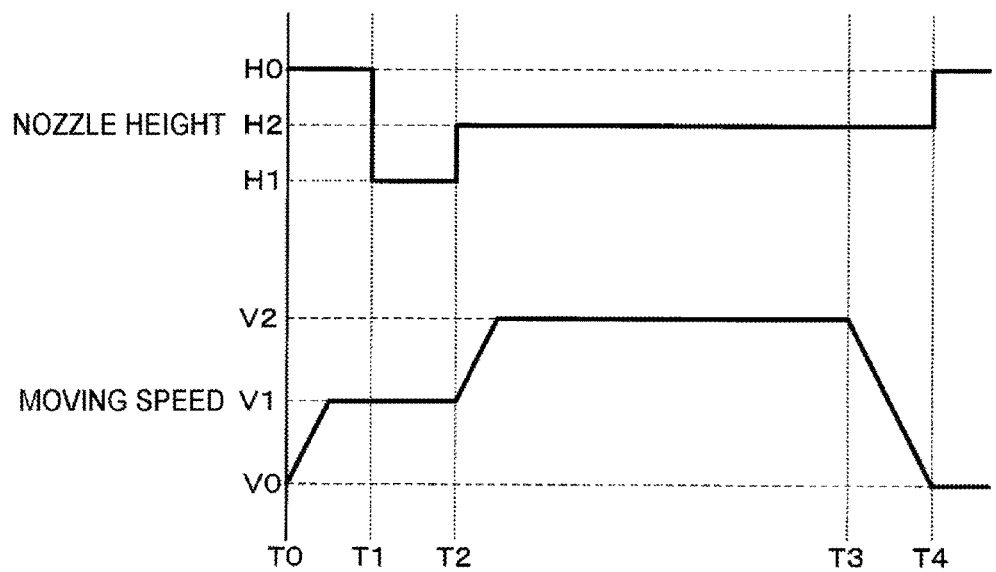
FIG. 5 is a time chart which represents the height position of the coating nozzle and the moving speed of a wafer in time series.

Hereinafter, descriptions will be made on a process of a coating processing which is performed in the coating processing apparatus 1 configured as described above. FIG. 5 is a time chart which represents the height position of the coating nozzle 30 and the moving speed of the wafer W in the coating processing, in time series.

When the coating processing is performed, first, the wafer W is carried into the coating processing apparatus 1 by a conveyance mechanism (not illustrated). The wafer W carried into the coating processing apparatus 1 is placed on the wafer holding unit 21 to be attracted and held (time T0 in FIG. 5). At time T0, the wafer W is stopped, and the moving speed of the wafer W is zero (V0).

Figure 6:
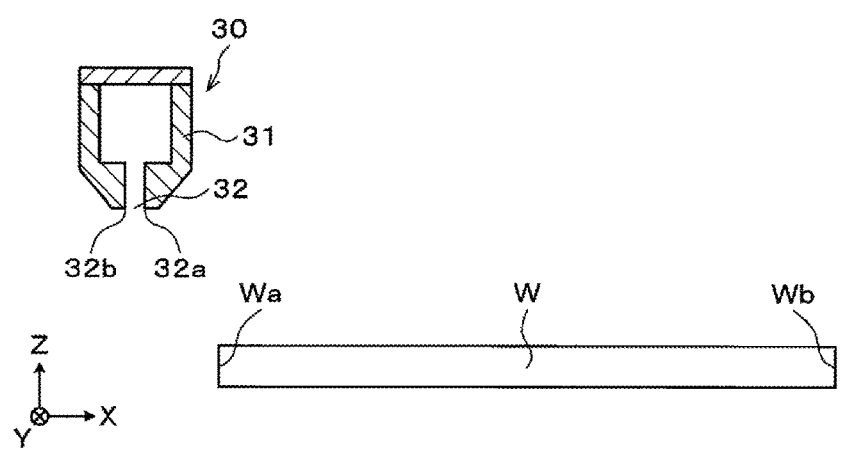
FIG. 6 is an explanatory view of a coating processing operation by the coating processing apparatus.
Figure 7:
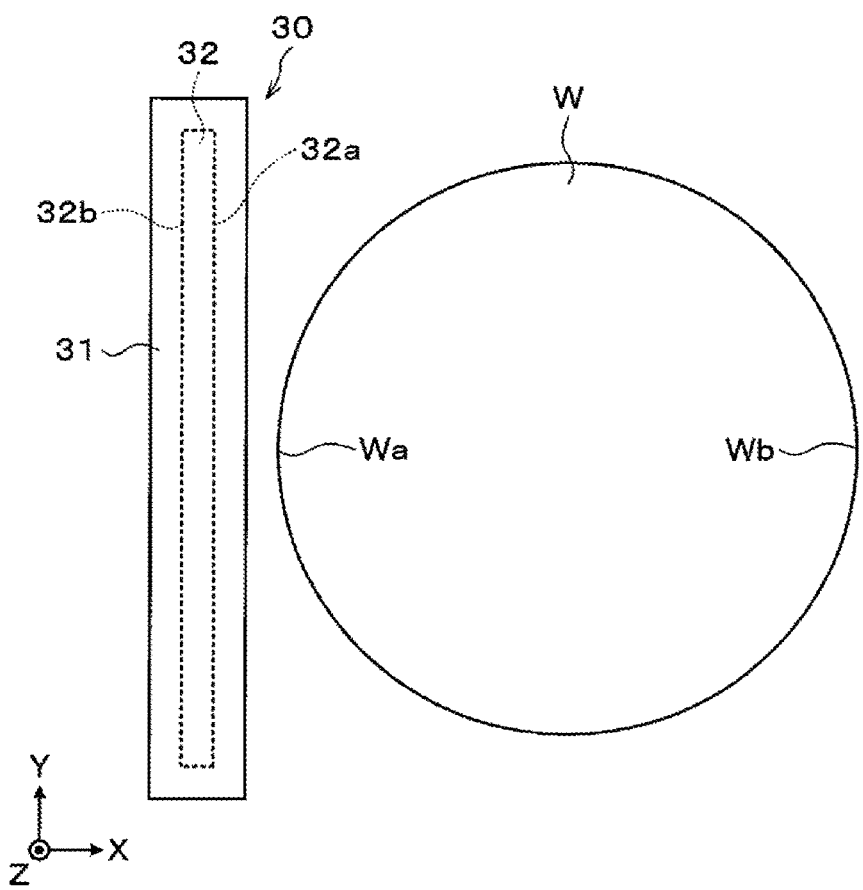
FIG. 7 is an explanatory view of a coating processing operation by the coating processing apparatus.

At time T0, the coating nozzle 30 is disposed at a standby height H0 where the coating nozzle 30 stands by before and after the coating processing. As illustrated in FIGS. 6 and 7, the ejecting port 32 of the coating nozzle 30 is disposed outside of the one end Wa of the wafer W. That is, the first end 32a of the ejecting port 32 at the wafer W side is located outside (at the negative X-axis direction side) of the one end Wa of the wafer W.

Figure 8:
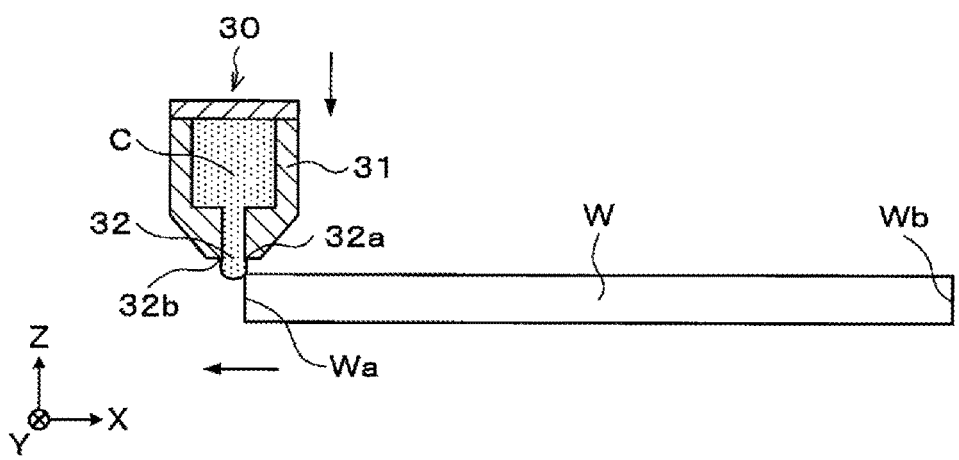
FIG. 8 is an explanatory view of a coating processing operation by the coating processing apparatus.
Figure 9:
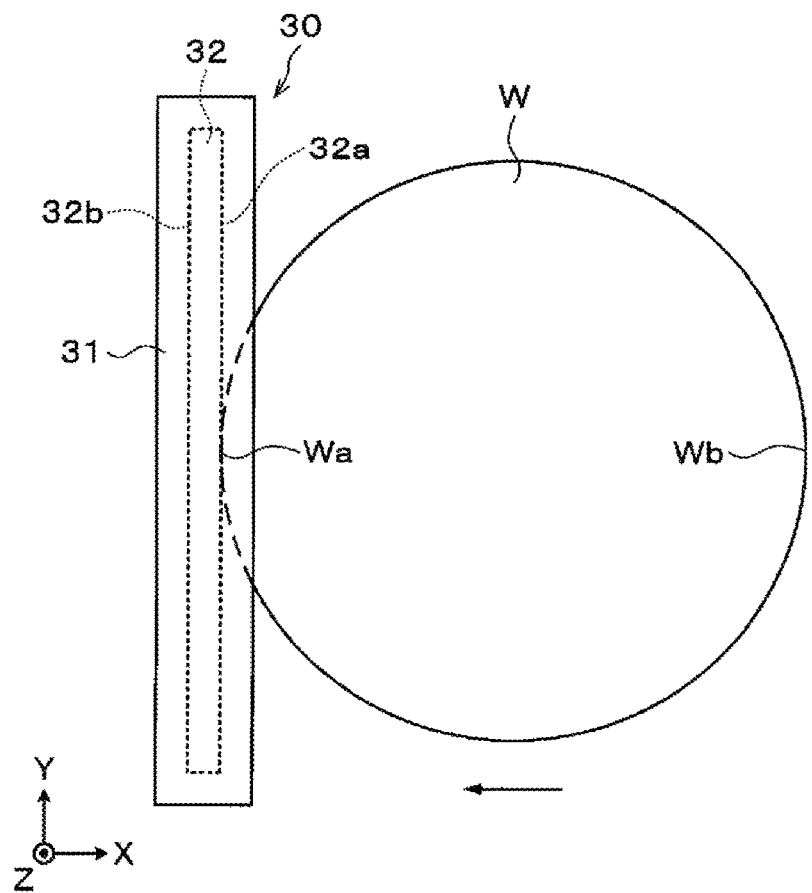
FIG. 9 is an explanatory view of a coating processing operation by the coating processing apparatus.

Then, the wafer W is moved by the moving mechanism 20 in the horizontal direction (negative X-axis direction), and as illustrated in FIGS. 8 and 9, the one end Wa of the wafer W is disposed at the first end 32a of the ejecting port 32 (time T1 in FIG. 5). At time T1, the wafer W is moving at a first speed V1.

At time T1, the coating nozzle 30 is moved down by the elevating mechanism 40, and is disposed at a liquid-contact height H1. Then, a coating liquid C is supplied from the coating liquid supply source 36 to the coating nozzle 30, and is drawn out from the ejecting port 32 of the coating nozzle 30 by surface tension. Then, the coating liquid C comes in contact with the one end Wa of the wafer W.

Figure 10:
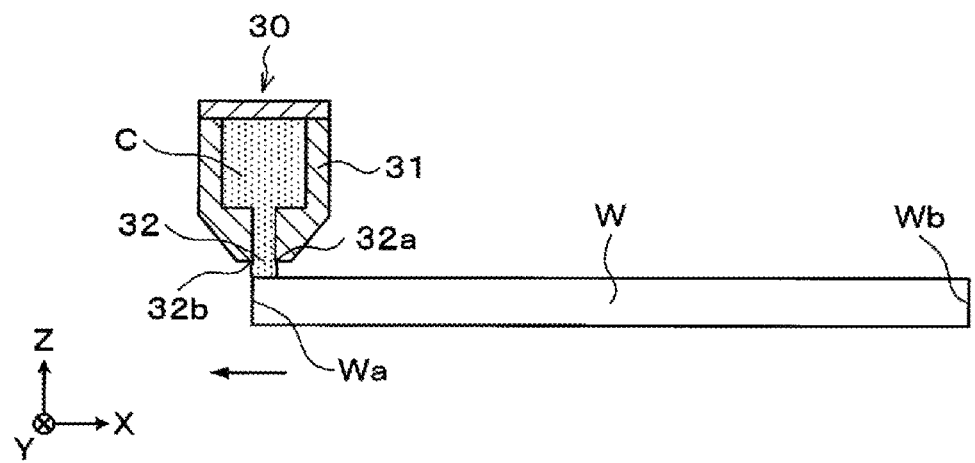
FIG. 10 is an explanatory view of a coating processing operation by the coating processing apparatus.
Figure 11:
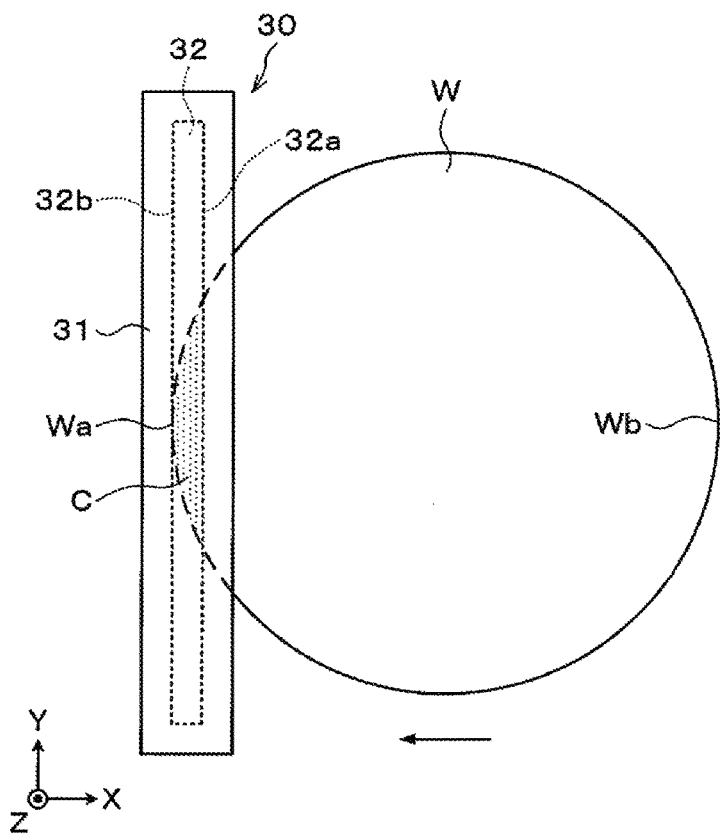
FIG. 11 is an explanatory view of a coating processing operation by the coating processing apparatus.

Next, after time T1, the wafer W is further moved by the moving mechanism 20 in the horizontal direction (negative X-axis direction), and as illustrated in FIGS. 10 and 11, the one end Wa of the wafer W is disposed at the second end 32b of the ejecting port 32 (time T2 in FIG. 5). From time T1 to time T2, the wafer W is moved at a constant first speed V1.

From time T1 to time T2, the height position of the coating nozzle 30 is maintained at the liquid-contact height H1. As described above, since the coating liquid C is in contact with the one end Wa of the wafer W at time T1, the coating liquid C is further drawn out from the ejecting port 32 by a capillary phenomenon according to the movement of the wafer W from time T1 to time T2 such that a pool of the coating liquid C between a peripheral top surface of the wafer W including the one end Wa of the wafer W and the ejecting port 32. In this manner, at time T2, while the one end Wa of the wafer is disposed at the second end 32b of the ejecting port, the coating liquid C drawn out from the ejecting port 32 is in contact with the one end Wa of the wafer W.

From time T1 to time T2, since the wafer W is moving at a low speed, that is, the first speed V1, the coating liquid C ejected from the ejecting port 32 may be securely brought into contact with the wafer W.

From time T1 to time T2, when the coating liquid C comes in contact with the one end Wa of the wafer W, the wafer W is moving. Thus, at the one end Wa of the wafer W, unlike in the conventional technology, the coating liquid C may be suppressed from being diffused in the longitudinal direction of the coating nozzle 30, and suppressed from being accumulated at the one end Wa.

Figure 12:
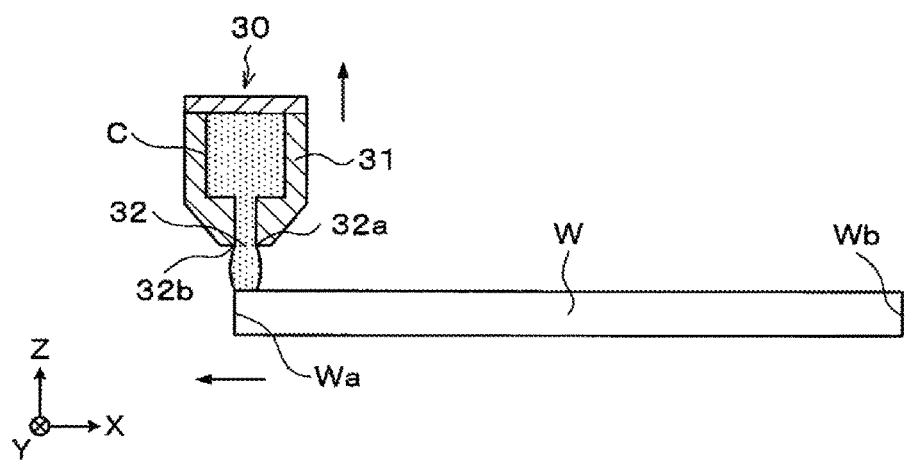
FIG. 12 is an explanatory view of a coating processing operation by the coating processing apparatus.

Then, when, at time T2, the coating liquid C is in contact with the wafer W as described above, and liquid pool of the coating liquid C is formed between the ejecting port 32 and the wafer W, the coating nozzle 30 is moved up by the elevating mechanism 40 to be disposed at a coating height H2 as illustrated in FIG. 12. The coating height H2 is set according to the film thickness of the coating liquid C coated on the wafer W.

Figure 13:
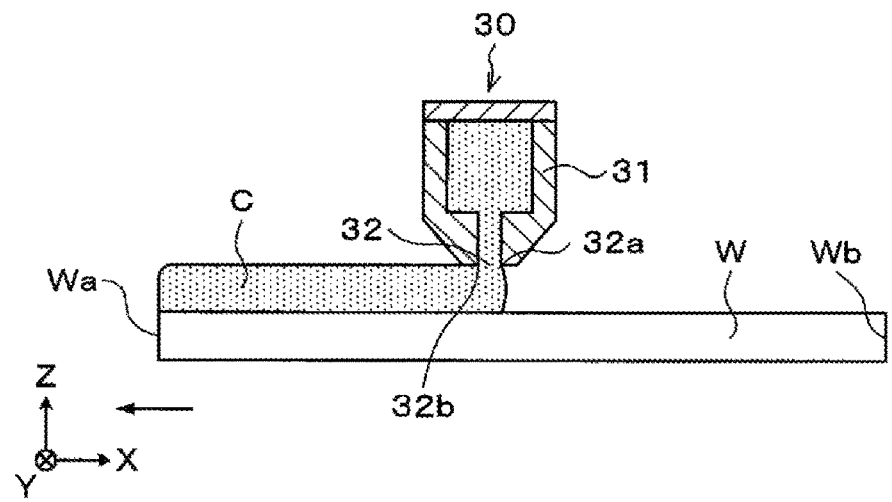
FIG. 13 is an explanatory view of a coating processing operation by the coating processing apparatus.
Figure 14:
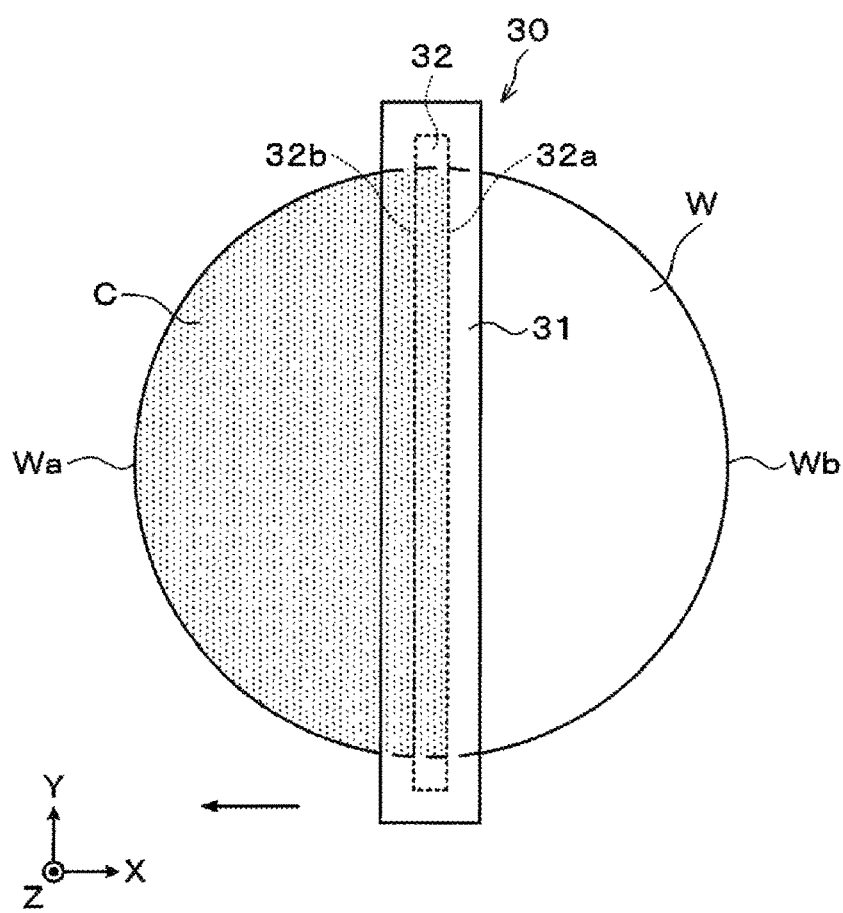
FIG. 14 is an explanatory view of a coating processing operation by the coating processing apparatus.

After time T2, as illustrated in FIGS. 13 and 14, while the coating liquid C ejected from the ejecting port 32 is in contact with the wafer W, the wafer W is further moved by the moving mechanism 20 in the horizontal direction (negative X-axis direction). Here, the wafer W is moved at a second speed V2 faster than the first speed V1. The height position of the coating nozzle 30 is maintained at the coating height H2. Then, the coating liquid C is drawn out from the ejecting port 32 by a capillary phenomenon to be coated on the wafer W.

Figure 15:
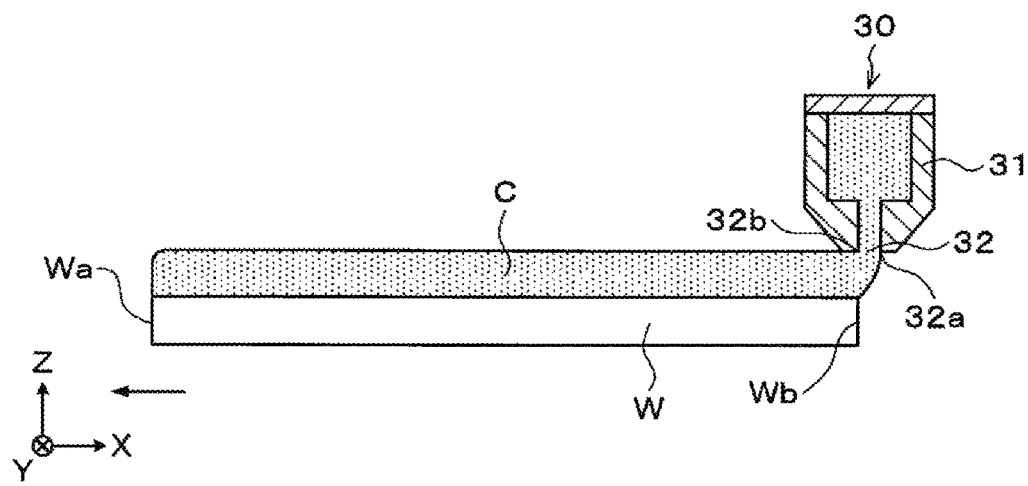
FIG. 15 is an explanatory view of a coating processing operation by the coating processing apparatus.
Figure 16:
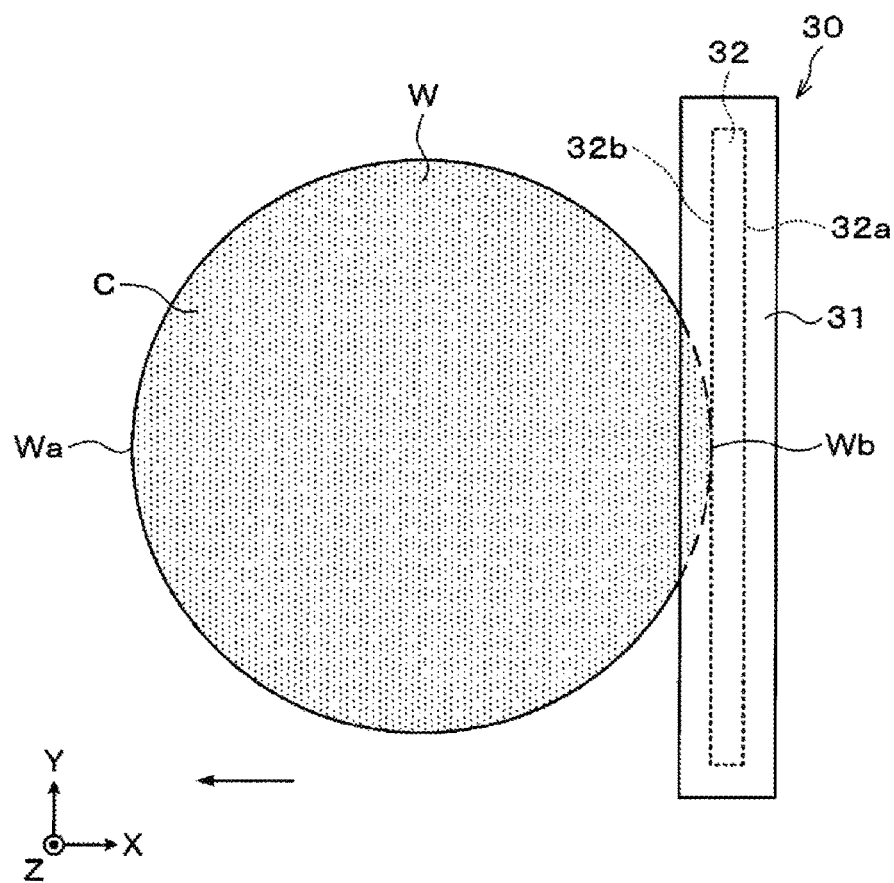
FIG. 16 is an explanatory view of a coating processing operation by the coating processing apparatus.

Then, as illustrated in FIGS. 15 and 16, the wafer W is moved by the moving mechanism 20 until the other end Wb is located at the second end 32b of the ejecting port 32 (time T3 in FIG. 5). From time T2 to time T3, the wafer W is moved at a constant second speed V2.

At time T3, the coating liquid C is exposed from the ejecting port 32 by surface tension, but the wafer W is not present just below the ejecting port 32. That is, the coating liquid C is not present between the ejecting port 32 and the wafer W. Accordingly, since a capillary phenomenon does not act, the coating liquid C is not drawn out from the ejecting port 32. At time T3, the coating liquid C is separated from the other end Wb of the wafer W. Then, the coating liquid C is coated on the whole surface of the wafer W.

At time T3, when the coating liquid C is separated from the other end Wb of the wafer W, the wafer W is moved. Thus, unlike the conventional technology, at the other end Wb of the wafer W, the coating liquid C may be suppressed from being diffused in the longitudinal direction of the coating nozzle 30, and suppressed from being accumulated at the other end Wb.

Figure 17:
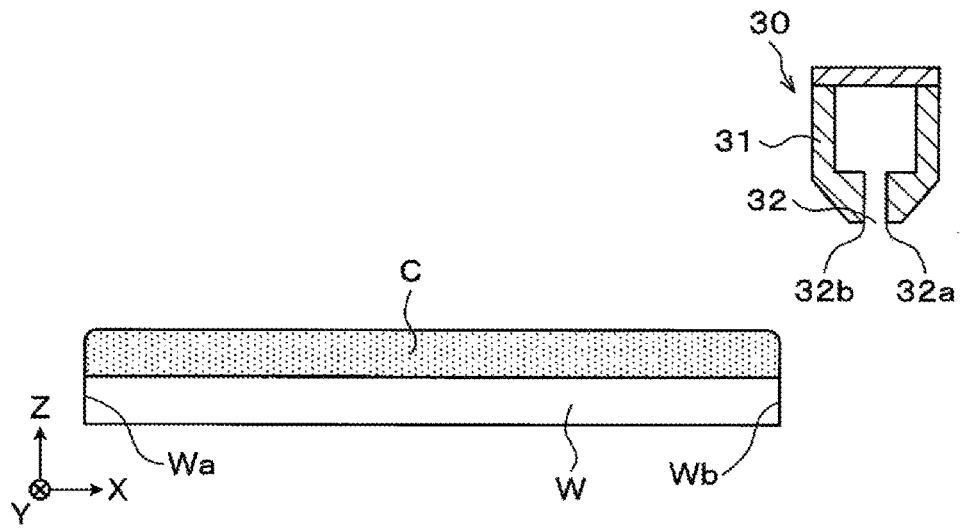
FIG. 17 is an explanatory view of a coating processing operation by the coating processing apparatus.
Figure 18:
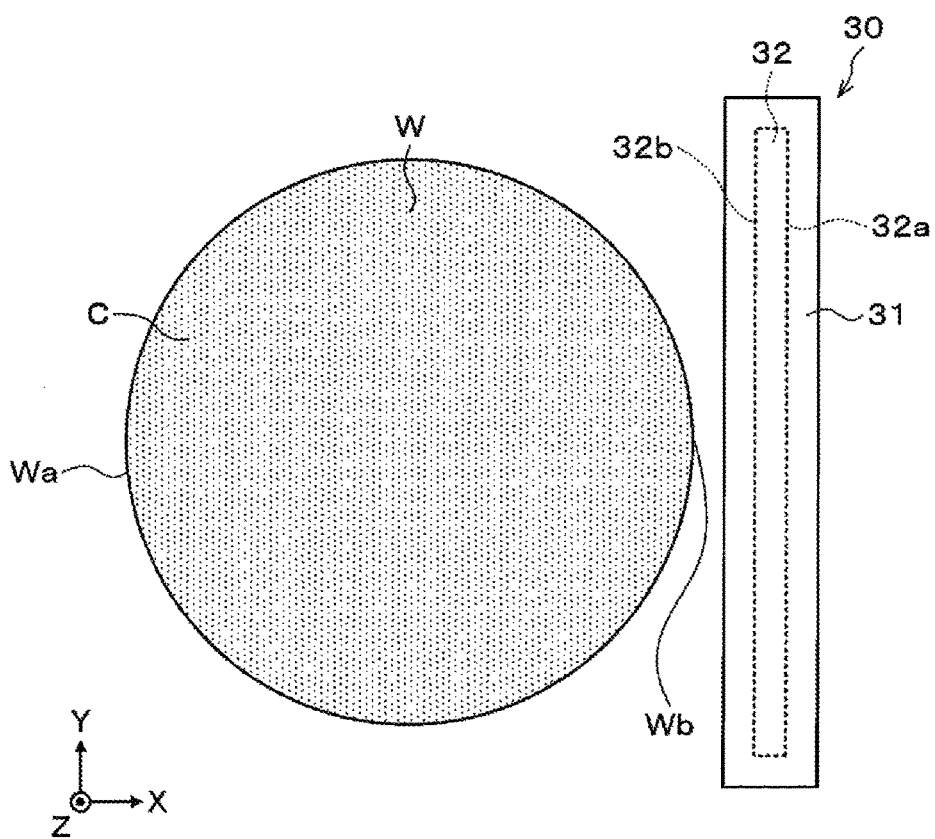
FIG. 18 is an explanatory view of a coating processing operation by the coating processing apparatus.

Then, after time T3, the moving speed of the wafer W is reduced by the moving mechanism 20 to stop the wafer W (time T4 in FIG. 5). Here, as illustrated in FIGS. 17 and 18, the ejecting port 32 of the coating nozzle 30 is disposed outside the other end Wb of the wafer W. That is, the second end 32b of the ejecting port 32 at the wafer W side is located outside (at the positive X-axis direction side) the other end Wb of the wafer W.

At time T4, the coating nozzle 30 is moved up by the elevating mechanism 40 to be disposed at the standby height H0. In this manner, a series of coating processings in the coating processing apparatus 1 is finished.

According to the exemplary embodiment described above, at the time of initiating the coating, that is, at time T1, when the first end 32a of the ejecting port 32 is located at the one end Wa of the wafer W and the coating liquid C ejected from the ejecting port 32 comes in contact with the one end Wa, the wafer W is moved in the horizontal direction. Thus, unlike the conventional technology, at the one end Wa of the wafer W, the coating liquid C may be suppressed from being diffused in the longitudinal direction of the coating nozzle 30, and suppressed from being accumulated at the one end Wa. Accordingly, it is possible to suppress the film thickness of the coating liquid C from becoming thick locally at the one end Wa of the wafer W.

At the time of finishing the coating, that is, at time T3, when the second end 32b of the ejecting port 32 is located at the other end Wb of the wafer W and the coating liquid C ejected from the ejecting port 32 is separated from the other end Wb, the wafer W is moved in the horizontal direction. Thus, unlike the conventional technology, at the other end Wb of the wafer W, the coating liquid C may be suppressed from being diffused in the longitudinal direction of the coating nozzle 30, and suppressed from being accumulated at the other end Wb. Accordingly, it is possible to suppress the film thickness of the coating liquid C from becoming thick locally at the other end Wb of the wafer W.

As described above, according to the present exemplary embodiment, the coating liquid C may be uniformly coated within the wafer plane.

As described above, at the time of initiating the coating, that is, at time T1, the coating liquid C may be suppressed from being accumulated at the one end Wa of the wafer W, and at the time of finishing the coating, that is, at time T3, the coating liquid C may be suppressed from being accumulated at the other end Wb of the wafer W. That is, the amount of the coating liquid C at the one end Wa and the other end Wb of the wafer W may be small. Here, when the amount of the coating liquid C in the peripheral edge of the wafer W is large, the coating liquid C is spilt out to the outside of the wafer W. Thus, the side surface or the back surface of the wafer W becomes dirty, and further, a mechanism for holding or conveying the wafer W is polluted. In some cases, the wafer W may be stuck to the mechanism by the coating liquid C, and thus may be broken. In this respect, in the present exemplary embodiment, the amount of the coating liquid C in the peripheral edge of wafer W may be small, which may improve the retention reliability or the conveyance reliability of the wafer W.

From time T1 to time T2, since the wafer W is moving at the low first speed V1, the coating liquid C ejected from the ejecting port 32 may be securely brought into contact with the wafer W. Also, from time T2 to time T3, since the wafer W is moving at the high second speed V2, the throughput of the coating processing may be improved.

In the present exemplary embodiment, when the one end Wa of the wafer W is located at the second end 32b of the ejecting port 32 at time T2, the moving speed of the wafer W is increased from the first speed V1. However, the timing of increasing the moving speed of the wafer W is not limited thereto. The moving speed may be increased at any time only after the coating liquid C comes in contact with the wafer W at time T2. However, in order to further improve the throughput of the coating processing as described above, it is desirable to increase the moving speed of the wafer W at time T2.

The present exemplary embodiment uses a method of coating the coating liquid C on the wafer W by drawing out the coating liquid C from the ejecting port 32 of the coating nozzle 30 by a capillary phenomenon, that is, a so-called capillary coating method. Thus, the coating liquid C supplied to the wafer W does not flow out of the wafer W, and thus only a required amount of the coating liquid C may be supplied from the coating nozzle 30 to the wafer W. Accordingly, for example, as compared to the spin coating method, the supply amount of the coating liquid C may be reduced.

In the coating processing apparatus 1 according to the exemplary embodiment described above, the wafer W is moved by the moving mechanism 20 in the horizontal direction, thereby relatively moving the wafer W and the coating nozzle 30. Meanwhile, the coating nozzle 30 may be moved in the horizontal direction. Alternately, both the wafer W and the coating nozzle 30 may be moved in the horizontal direction.

In the exemplary embodiment as described above, when the coating liquid C is coated on the wafer W, the coating liquid C is drawn out from the ejecting port 32 of the coating nozzle 30 by the capillary phenomenon. However, the method of supplying the coating liquid C to the wafer W from the coating nozzle 30 is not limited thereto. For example, the coating liquid C may be forcibly ejected from the ejecting port 32 of the coating nozzle 30 by, for example, a pump.

As for the coating liquid C used in the above described exemplary embodiment, any coating liquid may be used. For example, the present disclosure may also be employed in a case where an adhesive used for bonding substrates to each other, a coating liquid for sealing a circuit on the wafer W, or a coating liquid such as, for example, a polyimide or resist solution is coated on the wafer W.

An exemplary embodiment of the present disclosure has been described with reference to accompanying drawings, but the present disclosure is not limited thereto. it is apparent to those skilled in the art that various changes or modifications may be made within the scope of the spirit defined in claims, and it is understood that the changes and modifications also naturally belong to the technical scope of the present disclosure. The present disclosure is not limited to the exemplary embodiment, but various aspects may be employed. The present disclosure may also be employed in a case where the substrate is, for example, a flat panel display (FPD), or a mask reticle for a photomask, besides a wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A coating processing apparatus for coating a substrate with a coating liquid, the apparatus comprising: a coating nozzle including:
   a storage chamber having a rectangular cross section and configured to store the coating liquid therein; and
   an ejecting port which is a rectangular slit, provided below the storage chamber and connected to the storage chamber through a flow path vertically extended from the ejecting port to the storage chamber, the ejecting port being configured to draw out the coating liquid to a top surface of the substrate from the ejecting port by a capillary action of a capillary coating method,
   wherein the ejecting port is provided with a first end and a second end that extends in parallel in a longitudinal direction thereof, respectively and faces each other, and
   a carrier configured to move the substrate in a horizontal direction which is linear and perpendicular to a longitudinal direction of the ejecting port of the coating nozzle;
   an elevator configured to move the coating nozzle in a vertical direction between a standby height and a liquid-contact height; and
   a controller programmed with a non-transitory computer readable storage medium to control the coating nozzle, the carrier and the elevator,
   wherein the controller is programmed to:
   move the substrate by the carrier in the horizontal direction with respect to the ejecting port of the coating nozzle such that one end of a peripheral edge of a top surface of the substrate passes the first end of the ejecting port earlier than the second end of the ejecting port;
   move down the coating nozzle by the elevator from the standby height to the liquid-contact height when the one end of the peripheral edge of the top surface of the substrate passes the first end of the ejecting port;
   supply the coating liquid from a coating liquid supply source to the storage chamber of the coating nozzle so that a portion of the coating liquid is drawn out from the ejecting port by a surface tension of the coating liquid to come in contact with the one end of the peripheral edge of the top surface of the substrate while the one end of the peripheral edge of the top surface of the substrate is being moved by the carrier in the horizontal direction perpendicular to the longitudinal direction of the ejecting port to pass the first end of the ejecting port;
   after supplying the coating liquid, further move the substrate by the carrier in the horizontal direction with respect to the ejecting port of the coating nozzle such that the one end of the peripheral edge of the top surface of the substrate is disposed directly below the second end of the ejecting port that faces the first end of the ejecting port and the coating liquid s further drawn out from the ejecting port by the capillary action, thereby forming a pool of the coating liquid between a peripheral top surface of the substrate including the one end of the top surface of the substrate and the ejecting port;
   coat the coating liquid on the top surface of the substrate while moving the substrate in the horizontal direction perpendicular to the longitudinal direction of the ejecting port by the carrier until the other end of the peripheral edge of the top surface of the substrate passes the second end of the ejecting port while maintaining the pool of the coating liquid formed between the peripheral top surface of the substrate and the ejecting port in contact with the top surface of the substrate and the other end of the peripheral edge of the top surface of the substrate is being moved by the carrier In the horizontal direction perpendicular to the longitudinal direction of the ejecting port to pass the second end of the ejecting port, thereby coating an entire top surface of the substrate; and reduce a moving speed of the substrate by the carrier after the other end of the peripheral edge of the top surface of the substrate passes the second end of the ejecting port until the substrate is stopped wherein the controller is further programmed such that when the substrate is moved by the carrier, the substrate is further moved by the carrier at a first speed at least after the first end of the ejecting port is located at the one end of the peripheral edge of the top surface of the substrate and until the second end of the ejecting port is located at the one end of the peripheral edge of the top surface of the substrate, and when the coating liquid is coated on the top surface of substrate, the substrate is moved at a second speed in a linear direction, where said second speed is faster than the first speed.

2. The coating processing apparatus of claim 1, wherein the controller is further programmed to control the carrier such that the substrate is further moved at the first speed while maintaining the coating nozzle at the liquid-contact height.

3. The coating processing apparatus of claim 2, wherein the controller is further programmed to control the elevator such that after further moving the substrate by the carrier and before coating the top surface of the substrate with the coating liquid, the coating nozzle maintained at the liquid-contact height is moved up by the elevator to a coating height higher than the liquid-contact height.

4. The coating processing apparatus of claim 3, wherein the coating height is set according to a film thickness of the coating liquid to be coated on the top surface of the substrate.

5. The coating processing apparatus of claim 1, wherein when the moving speed of the substrate is reduced by the carrier, the controller is further programmed to:
    control the carrier such that the ejecting port of the coating nozzle is disposed outside the other end of the peripheral edge of the top surface of the substrate; and
    control the elevator such that the coating nozzle is moved up to the standby height.

* * * * *